United States Patent [19]
Gould et al.

[11] Patent Number: 5,113,400
[45] Date of Patent: May 12, 1992

[54] ERROR DETECTION SYSTEM

[75] Inventors: Adam F. Gould, Palatine; Phillip D. Rasky, Buffalo Grove, both of Ill.

[73] Assignee: Motorola, Inc., Schaumburg, Ill.

[21] Appl. No.: 616,517

[22] Filed: Nov. 21, 1990

[51] Int. Cl.$^5$ ............................................. G06F 11/10
[52] U.S. Cl. ............................................................ 371/43
[58] Field of Search ................ 371/43, 44, 45, 5.1, 371/5.2, 5.3, 5.4, 5.5, 37.1, 3, 38.1, 39.1, 37.4

[56] References Cited

U.S. PATENT DOCUMENTS

| | | | |
|---|---|---|---|
| 4,633,470 | 12/1986 | Welch | 371/37.1 |
| 4,843,607 | 6/1989 | Tong | 371/37.1 |
| 4,914,660 | 4/1990 | Hirose | 371/37.1 |
| 4,967,413 | 10/1990 | Otani | 371/43 X |

Primary Examiner—Robert W. Beausoliel
Attorney, Agent, or Firm—Robert H. Kelly

[57] ABSTRACT

An error detection system for a discrete receiver. The error detection system indicates bad frames of binary information signals which contain distorted bits in densities so great as to cause a convolutional decoder to generate an incorrect, decoded signal. A signal decoded by a convolutional decoder is re-encoded by an encoder, and the re-encoded signal is compared with the signal received by the receiver. When portions of the re-encoded signal differ too greatly from the actual, received signal, a bad frame indication is generated.

19 Claims, 4 Drawing Sheets

ERROR DETECTION SYSTEM

BACKGROUND OF THE INVENTION

The present invention relates generally to error detection systems for detecting errors of discretely-encoded signals, and, more particularly, to a bad frame indicator for detecting bad frames of information signals received by a receiver constructed to receive discretely-encoded signals comprised of coded frames.

A communication system operative to transmit information includes, at minimum, a transmitter and a receiver interconnected by a transmission channel. A radio communication system is a communication system in which the transmission channel is comprised of a radio-frequency channel. A transmitter which transmits an information signal upon the radio-frequency channel must convert the information signal into a form which may be transmitted upon the radio-frequency channel. The process by which the information signal is converted into a form which may be transmitted upon a radio-frequency channel is referred to as modulation. In a modulation process, the information signal is impressed upon a radio-frequency electromagnetic wave. The characteristic frequency of the radio-frequency electromagnetic wave is of a value which corresponds in frequency to be within a range of frequencies defining the radio-frequency channel. The radio-frequency electromagnetic wave is commonly referred to as a carrier wave, and the carrier wave, once modulated by the information signal, is referred to as a modulated, information signal. The modulated, information signal occupies a frequency bandwidth comprising a range of frequencies centered at, or close to, the frequency of the carrier wave. The modulated, information signal may be transmitted through free space upon the radio-frequency channel thereby to transmit the information signal between the transmitter and the receiver.

Various techniques have been developed for modulating the information signal upon the carrier wave. Such techniques include amplitude modulation (AM), frequency modulation (FM), phase modulation (PM), and complex modulation (CM). A receiver receives the modulated, information signal transmitted upon the radio-frequency channel, and contains circuitry to detect, or recreate otherwise, the information signal from the modulated, information signal transmitted thereto. This process is referred to as demodulation. Typically, the receiver contains both demodulation circuitry for demodulating the received signal, and, additionally, down conversion circuitry for converting downward in frequency the radio-frequency, modulated, information signal.

Numerous transmitters may be operative simultaneously to modulate and transmit information signals over different radio-frequency channels. As long as the signals transmitted by the numerous transmitters are transmitted upon different radio-frequency channels, no overlapping of simultaneously-transmitted signals occur. Receivers positioned to receive the transmitted signals contained tuning circuitry to pass only signals transmitted upon a desired radio-frequency channel.

The electromagnetic frequency spectrum is divided into frequency bands, each of which defines a range of frequencies of the electromagnetic frequency spectrum. The frequency bands are further divided into channels, such channels being referred to hereinabove as radio-frequency channels. Such channels are also frequently referred to as transmission channels. To minimize interference between simultaneously-transmitted signals, transmission of signals upon the channels of certain ones of the frequency bands of the electromagnetic frequency spectrum is regulated.

For instance, in the United States, a portion of a 100 MHz frequency band, extending between 800 MHz and 900 MHz, is allocated for a radiotelephone communication. Portions of corresponding frequency bands are similarly allocated for radiotelephone communications in other geographical areas. Radiotelephone communication may, for example, be effectuated by radiotelephones utilized in a cellular, communication system. Such radiotelephones include circuitry to permit both reception and transmission of modulated, information signals.

A cellular, communication system is formed by the positioning of numerous base stations at spaced-apart locations throughout a geographical area. Each base station contains circuitry to receive modulated, information signals transmitted by radiotelephones, and circuitry to transmit modulated, information signals to the radiotelephones.

Careful selection of the positions in which each of the base stations is located permits at least one base station to be within the transmission range of a radiotelephone positioned at any location throughout the geographical area. Portions of the geographical area proximate to individual ones of the base stations are defined to be associated with the individual ones of the base stations, and a base station and the portion of the geographical area associated therewith are defined to be a "cell". A plurality of cells, each associated with a base station, together form the geographical area encompassed by the cellular, communication system. A radiotelephone positioned within the boundaries of any of the cells of the cellular, communication system may transmit, and receive, modulated, information signals to, and from, at least one base station.

Increased usage of cellular, communication systems has resulted, in many instances, in the full utilization of every transmission channel of the frequency band allocated for cellular, radiotelephone communication. As a result, various ideas have been proposed to utilize more efficiently the frequency band allocated for radiotelephone communications. More efficient utilization of the frequency band allocated for radiotelephone communications increases the transmission capacity of a cellular, communication system.

One such means by which the transmission capacity of the cellular, communication system may be increased is to utilize a digital, or other discrete, modulation technique. When an information signal is converted into discrete form, a single transmission channel may be utilized to transmit, sequentially, more than one information signal. Because more than one information signal may be transmitted upon a single transmission channel, the transmission capacity of an existing frequency band may be increased by a multiple of two or more.

Typically, an information signal is first converted into discrete form (such as, for example, by an analog-to-digital converter), and then encoded by some coding technique prior to modulation and transmission thereof over a transmission channel.

Coding of the signal increases the redundancy of the signal, and such redundancy facilitates accurate determination of the signal once received by a receiver. A radio-frequency channel is not, however, a noise-free transmission channel; therefore, noise and other transmission difficluties, may cause a receiver to receive a signal other than that which was transmitted by the transmitter. Because an encoded signal contains redundancies, the receiver oftentimes may accurately decode the received signal to determine the actual information signal even when the encoded signal has been distorted during transmission thereof. Various block coding and convolutional coding techniques have been developed to facilitate accurate recreation of an information signal. One such convolutional coding technique is a Viterbi coding technique.

When distortion of the transmitted signal results in the receiver receiving bursts of distorted information, the decoder incorrectly decodes the received signal. Such incorrect decoding of the received signal results in the receiver recreating a signal other than the intended, information signal.

Parity bits oftentimes are included as a portion of the encoded signal transmitted by the transmitter. When a receiver receives the encoded signal having parity bits of values which are different than a predetermined sequence of values, that portion of the signal is ignored by the receiver. However, by random process, the parity bits may be of values indicative of an undistorted signal, and a receiver may incorrectly determine that a distorted signal has been accurately transmitted, and recreate thereby an incorrect signal.

For instance, when a discrete, encoded signal is comprised of sequences of digitally-encoded words (also referred to as frames), parity bits may be interspersed among, or concatenated to the bits which comprise the word or frame. If three parity bits are transmitted with each word or frame, the parity bits may form any of eight combinations. While a receiver must detect a specific combination of values of the parity bits to indicate that a valid signal has been received by the receiver, by random process, an undesired signal, such as a noise-only signal, may have values corresponding to the desired combination of parity bits. When a noise-only signal is received by the receiver, and the receiver searches for three parity bits per word or frame, the receiver may incorrectly determine that an invalid signal is a valid word as often as one out of eight times.

When a base station and a radiotelephone communicate in a process referred to as discontinuous transmission (DTX), the base station and radiotelephone transmit information only when information is detected at the radiotelephone. At all other times, the transmitter portion of the radiotelephone is inoperative to conserve radiotelephone power, while the receiver portion of the radiotelephone remains operative to detect reception of valid information. However, when the base station does not transmit information to the radiotelephone (referred to as non-transmit periods), the receiver portion of the radiotelephone receives only noise.

Because, by random process, a noise-only signal may be interpreted by a receiver as valid information one out of eight times when the receiver searches for the values of three parity bits, the receiver incorrectly determines that a noise signal is valid information signal one out of eight times. At a word or frame rate of 217 Hz, a noise-only signal may be incorrectly determined to be a valid information signal by the receiver 27 times per second. Such incorrect determination by the receiver results in undesired noise levels (sometimes audibly noticeable as squelching to be processed by the receiver).

What is needed, therefore, is a more accurate system by which invalid signals may be rejected by a receiver.

SUMMARY OF THE INVENTION

The present invention, accordingly, provides an error detection system for a discrete receiver.

The present invention further advantageously provides a bad frame indicator for a receiver constructed to receive a discretely-encoded signal comprised of coded frames.

The present invention still further advantageously provides a transceiver constructed to receive a discretely-encoded signal comprised of coded frames of a predetermined number of bits.

The present invention yet further advantageously provides a method for detecting when sequences of a discretely-encoded signal received by a receiver, constructed to receive discretely-encoded signals, are comprised of excessive numbers of invalid signal portions.

In accordance with the present invention, an error detection system for a receiver constructed to receive a discretely-encoded signal, wherein the error detection system is operative to detect when a sequence of the discretely-encoded signal received by the receiver is comprised of an excessive number of invalid signal portions, is disclosed. The error detection system includes a decoder for decoding the discretely-encoded signal received by the receiver and applied thereto, and for generating a decoded signal responsive to values of the discretely-encoded signal. A coder re-encodes the decoded signal generated by the decoder and generates a discrete, receiver-encoded signal responsive to values of the decoded signal. A comparator compares the discrete, receiver-encoded signal generated by the coder with the discretely-encoded signal received by the receiver. An error signal is generated responsive to times to which values of signal portions of a sequence of the discretely-encoded signal received by the receiver differ with values of a corresponding sequence of the discrete, receiver-encoded signal received by the receiver in a density in excess of a predetermined value.

BRIEF DESCRIPTION OF THE DRAWINGS

The present invention will be better understood when read in light of the accompanying drawings in which.

DETAILED DESCRIPTION OF THE PREFERRED EMBODIMENT

Figure 1:
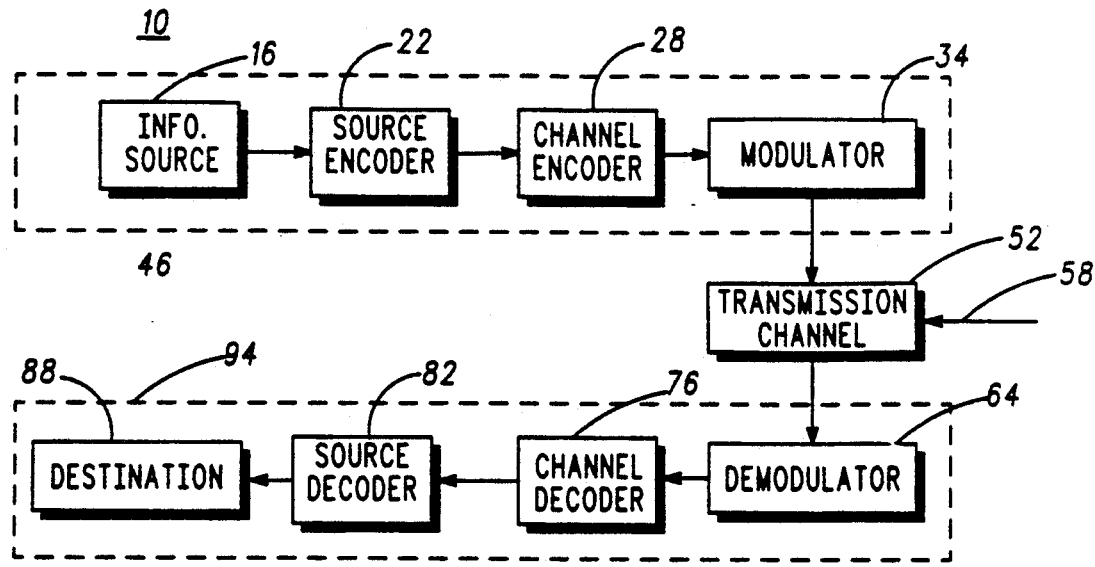
FIG. 1 is a block diagram of a communication system operable to transmit and receive discretely-encoded information signals.

Referring first the block diagram of FIG. 1, a communication system, referred to generally by reference numeral 10, is operable to transmit and receive discretely-encoded information signals. The error detection system of the present invention is operable to detect times when erroneous information is received by a receiver portion of communication system 10.

An information source, here represented by block 16, is representative of the source of an information signal such as, for example, a voice signal. In instances in which information source 16 is comprised of a voice signal, information source 16 additionally includes a transducer for converting the voice signal into electrical form.

The information signal generated by information source 16 is supplied to source encoder 22. Source encoder 22 converts the information signal supplied thereto, which is typically in an analog form, into a discrete signal. Source encoder 22 may, for example, be comprised of an analog-to-digital converter which generates a digital signal thereby.

The discrete signal generated by source encoder 22 is supplied to channel encoder 28. Channel encoder 28 encodes the discrete signal supplied thereto according to a coding technique. Channel encoder 28 may, for example, comprise a block and/or convolutional encoder. Channel encoder 28 functions to convert the discrete signal supplied thereto into an encoded form to increase the redundancy of the discrete signal thereby. By increasing the redundancy of the signal, transmission errors and other signal distortions caused during transmission of a signal are less likely to prevent a receiver portion of communication system 10 from detecting the actual transmitted signal.

The encoded signal generated by channel encoder 28 is supplied to modulator 34. Modulator 34 modulates the encoded information signal supplied thereto according to a modulation technique, such as one of the modulation techniques noted hereinabove. Modulator 34 generates a modulated, information signal.

Information source 16, source encoder 22, channel encoder 28, and modulator 34 together comprise the receiver portion, referred to by block 46, shown in hatch, of communication system 10.

The modulated, information signal generated by modulator 34 is transmitted upon a transmission channel, here indicated by block 52. Because a transmission channel is not a noise-free channel, noise is applied to the modulated, information signal when the modulated, information signal is transmitted thereupon. The noise signal is indicated in the figure by line 58 applied to transmission channel 52.

The modulated, information signal transmitted upon transmission channel 52 is received by demodulator 64. Demodulator 64 generates a demodulated signal which is supplied to channel decoder 76. Channel decoder 76 corresponds to channel encoder 28 of receiver portion 46, but functions to decode the encoded signal encoded by the block and/or convolutional coder or comprising channel encoder 28. Channel decoder 76 generates a decoded signal, in discrete form, which is supplied to source decoder 82. Source decoder 82 converts the discrete signal supplied thereto into a form suitable for application to destination 88. Destination 88 may, for example, comprise an ear piece or speaker portion of a receiver, or another such transducer for converting the electrical signal supplied thereto into human perceptible form.

Demodulator 64, channel decoder 76, source decoder 82, and destination 88 together comprise the receiver portion, indicated by block 94, shown in hatch, of communication system 10.

Figure 2A:
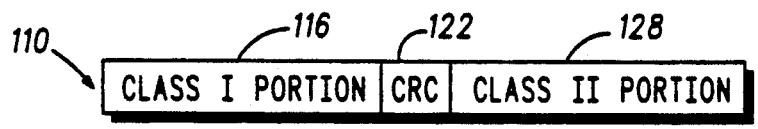
FIG. 2A is a representation of one frame of a digitally-encoded information signal.

Turning now to FIG. 2A, a single frame of a digitally-encoded information signal is represented. A frame is defined as a pre-determined number of bits, here digital bits. The digital bits, when positioned in sequential fashion, together form a coded word, alternately referred to as a codeword or an encoded signal. Frame 110 of FIG. 2A is representative of an encoded signal generated by source encoder 22 of FIG. 1. Frame 110 of FIG. 2A forms a codeword of 260 digital bits in length. As illustrated, frame 110 is comprised of class one portion 116 of 179 bits, parity bit portion 122 (alternately referred to by the term cyclic redundancy check, or CRC, portion of a length of three bits, and class two bit portion 128 of 78 bits in length. Other frame lengths and configurations, are, of course, possible; frame 110 of FIG. 2A is indicative of but one possible frame comprised of digitally-encoded bits.

Figure 2B:
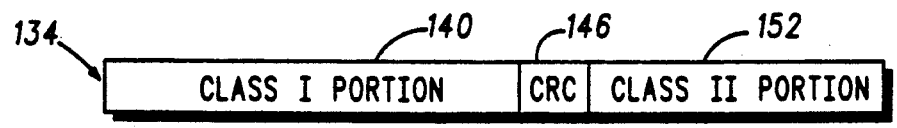
FIG. 2B is a representation of the frame of the digitally-encoded information signal of FIG. 2A encoded according to a coding technique to form signal redundancies therein.

FIG. 2B is a representation of a single frame 134 in which the class one bit portion 116 has been encoded according to a coding technique, such as the Viterbi coding technique of a Viterbi convolutional coder. The class one bit portion 140 of frame 134 of FIG. 2B is of length of 378 bits, and is representative of a signal generated by channel encoder 28 of transmitter 46 of the communication system 10 of FIG. 1. Parity bit portion 146 (i.e., CRC portion 146) corresponds in length with parity bit portion 122 of FIG. 2A, and class two bit portion 152 of frame 134 corresponds in length to class two bit portion 128 of frame 110 of FIG. 2A. Class one bit portion 140 is of an increased bit length relative to bit portion 116 of frame 110 to increase thereby the redundancy of bit portion, thereby to reduce the possibility that distortion of the frame 134 during transmission thereof would prevent accurate recreation of the actual information signal comprising bit portion 116 of frame 110. Greater, or smaller, portions of a frame may be encoded by a conventional coding technique, as desired.

Figure 2C:
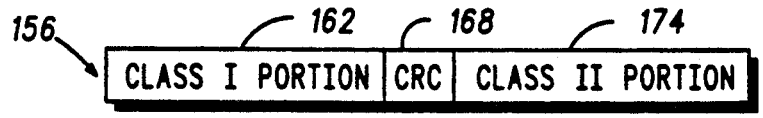
FIG. 2C is a representation of the frame of the digitally encoded information signal received by the receiver and decoded by a decoder according to a decoding technique corresponding to the coding technique used to encode the digitally encoded information signal.

FIG. 2C is a representation of frame 156 indicative of a frame received and decoded by a decoder portion of a receiver such as receiver portion 94 of FIG. 1. Frame 156 is comprised of class one bit portion 162, parity bit (i.e., CRC) portion 168, and class two bit portion 174. Ideally, frame 156 of FIG. 2C is identical to frame 110 of FIG. 2A. However, as described hereinabove, because the transmission channel (indicated in FIG. 1 by block 52) is not a noise-free signal, distortion of the signal occurring during transmission thereof may cause one, or many bits of portions 162, 168 and 174 to differ from corresponding portions 116, 122, and 128 of frame 110.

Use of a coding technique, here a convolutional coding technique, such as a Viterbi, convolutional coding technique, reduces the possibility that distortion of class one bit portion 140 occurring during transmission thereof would prevent accurate recreation of the actual class 1 bit portion 116 of frame 110. However, as is known, when distortion causes changes in the values of bits in too great of a density of at least a portion of bit portion 140 of frame 134, decoding of the received signal does not recreate the actual, information signal of bit portion 116 of frame 110, but, rather, generates an incorrect information signal.

As previously mentioned, by random process, distortion of the values of parity bits during transmission may actually provide a positive indication (although an incorrect positive indication) that the transmitted signal was transmitted in undistorted form. Such incorrect indication of an undistorted signal permits invalid information to be considered to be an undistorted, transmitted signal.

Figure 3:
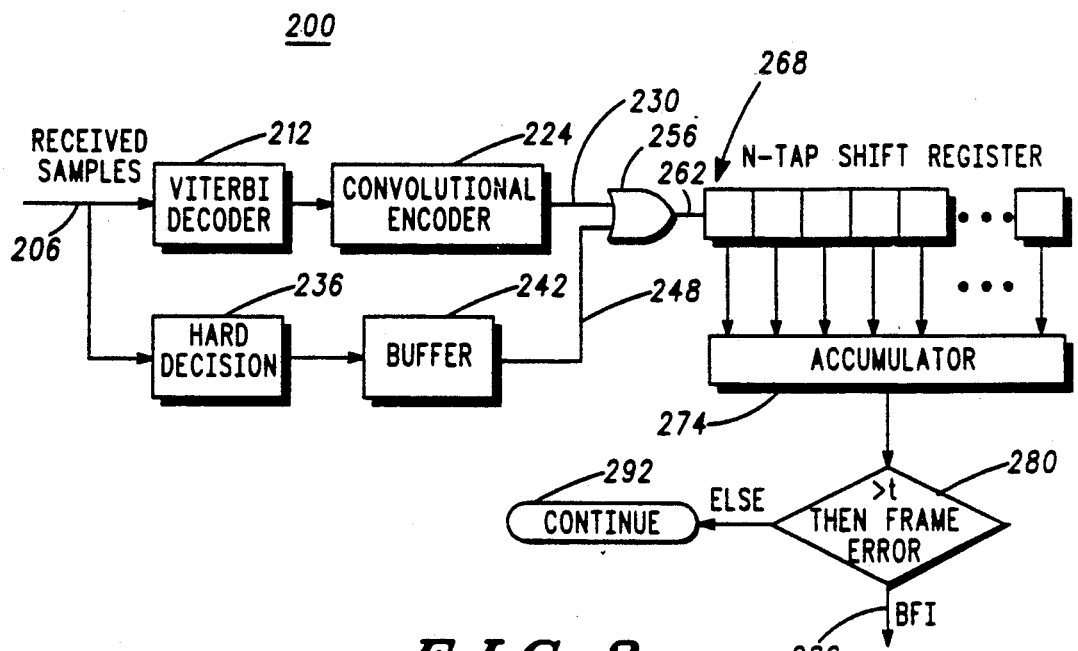
FIG. 3 is a partial functional block, partial flow diagram of the error detection system of the present invention.

FIG. 3 is a functional block diagram of the error detection system, referred to generally in the figure by reference numeral 200, of the present invention. Error detection system 200 is operative to receive at least samples of the transmitted signal received by a receiver. The received signal received by a receiver (which is an analog signal upon which the discretely-encoded information is modulated) is supplied on line 206 to Viterbi decoder 212. The signal supplied to Viterbi decoder 212 is utilized as a soft decision signal. Viterbi decoder 212 generates a decoded signal on line 218 which is supplied to convolutional encoder 224. Convolutional encoder 224 generates an encoded signal on line 230 which, in the absence of significant amounts of distortion of the signal transmitted to the receiver, is identical to the signal supplied to decoder 212 on line 206. However, as mentioned previously, when portions of the signal are distorted in significant densities during transmission thereof, the decoder 212 incorrectly decodes the received signal, and the re-encoded signal generated on line 230 (which is not susceptible to distortions caused by noise on the transmission channel) differs from the signal supplied to decoder 212 on line 206.

Line 206 is coupled to hard decision block 236 whereat the signal supplied on line 206 is converted into a series of digital pulses which are stored in buffer 242. Buffer 242 is of a capacity at least as great as the length of a transmitted frame, such as frame 134 of FIG. 2B. Buffer 242 provides an output on line 248 to allow the contents of buffer 242 to be supplied sequentially to logical exclusive-OR gate 256. The re-encoded signal generated on line 230 is additionally supplied to the logical exclusive-OR gate 256. While gate 256 is comprised of an exclusive-OR gate, and the following description describes operation of the invention in terms of such, it is to be noted that other logic gates, and logical systems may alternately be utilized.

Gate 256 is operative to determine when the re-encoded signal generated by encoder 224 on line 230 differs from the signal supplied on line 206. Exclusive-OR gate 256 generates a comparison signal on line 262, and the comparison signal is supplied, in serial fashion to shift register 268. Each bit of the comparison signal generated on line 262 and supplied to shift register 268 is supplied to accumulator 274. Accumulator 274 determines when portions of the comparison signal stored in shift register 268 indicates that an excessive number of differences between the signals supplied to gate 256 on lines 230 and 248, respectively.

Because, in the preferred embodiment, gate 256 comprises an exclusive-OR logic gate dissimilarities between bits supplied on lines 230 and 248 to gate 256 causes gate 256 to generate a bit value of a logical one responsive to such comparison. The contents of accumulator 274 may then be utilized to determine when excessive numbers of logical ones are detected in at least one portion of the comparison signal stored in shift register 268. When an excessive number of dissimilarities between the signals generated on lines 230 and 248 exist, and as indicated by decision block 280, a bad frame indicator is generated on line 286. Otherwise, no bad frame indicator is generated, as indicated by the branch to continue block 292. The density of bit dissimilarities detected by gate 256 required to cause the generation of a bad frame indication is, of course, dependent upon the number of bits of which the frames are comprised and of the metrics of the Viterbi coder utilized to decode the frames comprising the information signal.

It is to be noted that, while error detection system 200 of FIG. 3 is shown in partial block, partial logical sequence form, in the preferred embodiment, error detection system 200 is a software implemented system. That is, each block of error detection system 200 is preferably embodied as a portion of an algorithm executed by a digital processor. A partial, or total, hardware implementation is, of course, similarly possible.

Figure 4A:
FIG. 4A is a representation of a single frame of an information signal received by a receiver and re-encoded by the error detection system of the present invention.

FIG. 4A is a representation of a single frame 320 of a typical information signal received and re-encoded by the convolutional encoder 224 of the error detection system of FIG. 3. For purposes of illustration, values of several of the bits of which the frame is comprised are indicated in the figure. Frame 320 corresponds to the re-encoded signal supplied on line 230 to gate 256 of FIG. 3.

Figure 4B:
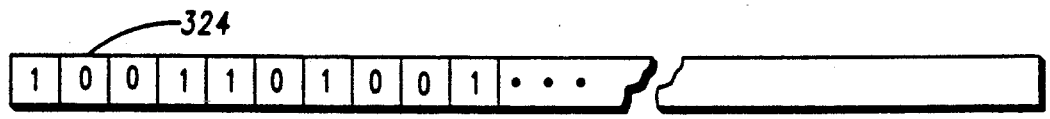
FIG. 4B is a representation of a single frame of a signal, in encoded form, received by a receiver of the present invention.

FIG. 4B is a representation, similar to that of the representation of FIG. 4A, but representative of a single frame 324 of an encoded signal received by a receiver and supplied to gate 256 on line 248. Similar to frame 320 of FIG. 4A, for purposes of illustration, values of selected ones of the bits of which frame 324 is comprised are indicated in the figure. It is to be noted that the values assigned to the bit locations are for purposes of illustration.

Figure 4C:
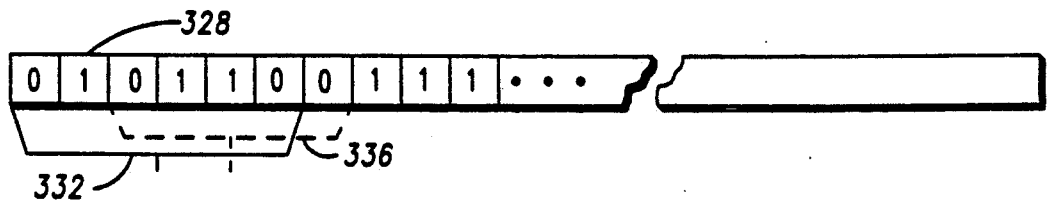
FIG. 4C is a representation of a comparison signal generated by a comparison between the signals represented in FIGS. 4A and 4B, and when those utilized to detect the presence of erroneous information according to the error detection system of the present invention.

FIG. 4C is a representation of a single frame, here frame 328, of a comparison signal generated on line 262 of FIG. 3 resulting from a comparison of frame 320 and frame 324 of FIGS. 4A and 4B, respectively. It may be discerned that when a bit of frame 320 is of the same value as that of a corresponding bit of frame 324, the corresponding bit of frame 328 is a value of a logical zero. When the value of a bit of frame 320 is dissimilar with that of a corresponding bit of frame 324, the corresponding bit of frame 328 is a value of a logical one.

As mentioned previously, because a coder/decoder of a transmitter/receiver is operative to minimize the effects of distortions caused during transmission of an information signal between a transmitter and a receiver, a decoder, such as Viterbi decoder 212 of FIG. 3, facilitates accurate decoding of an actual, received signal into a signal corresponding to an actual, transmitted signal transmitted by a transmitter. Properly, therefore, frame 320, representative of a signal supplied on line 230 to gate 256, may differ in value with the bits of frame 324, representative of the frame applied on line 248 to gate 256.

However, when a signal received by Viterbi decoder 212 differs too greatly (or, more particularly, when the density of the distortions differ too greatly) from an actual, transmitted signal, the decoder 212 incorrectly decodes the received frame. In such instances, a greater number of dissimilarities in value of the signal supplied to gate 256 on lines 230 and 248 are generated.

By determining the number of dissimilarities at selected portions of frame 328 of the comparison signal generated on line 262 an indication of when the decoder 212 improperly decodes an actual transmitted signal may be determined. It is noted that rather than merely determining the total number of dissimilarities in value between frames 320 and 324, the density (or frequency over selected portions of the frame) of dissimilarities over portions of the frame 328 are determined. Portions of the frame, referred to as windows, such as portions indicated by reference numerals 332 and 336 may be separately analyzed to count the number of dissimilarities of the comparison signal of the frame 328. Additional windows of the frame may be separately analyzed, and if any window of the frame has too great of number of dissimilarities, a bad frame indication is generated. When a bad frame indication is generated, the entire frame is ignored by the receiver. The bit-size of the windows (i.e., the window size) is determined responsive to the free distance, $d_{free}$, between possible codewords of the convolutional code used to encode the information signal.

In a preferred embodiment of the present invention, the accumulator, referred to by reference numeral 274 in FIG. 3, counts the number of errors (i.e., logical ones) within a particular window, and the contents of the accumulator are compared with a threshold value (referred to by letter "t" in decision block 280 of FIG. 3). If the contents of the accumulator are greater than the threshold value, a bad frame is indicated. Otherwise, a new window location is defined, the accumulator is cleared, and the process is repeated. Preferably, windows overlap with one another, and the windows are defined by a shifting process. Alternately, window locations may be pre-defined by, for example, predetermining the window to be at a first location, such as the start of the encoded portion of the frame, and then at a second location, such as at an end portion of the encoded portion of the frame.

Figure 5:
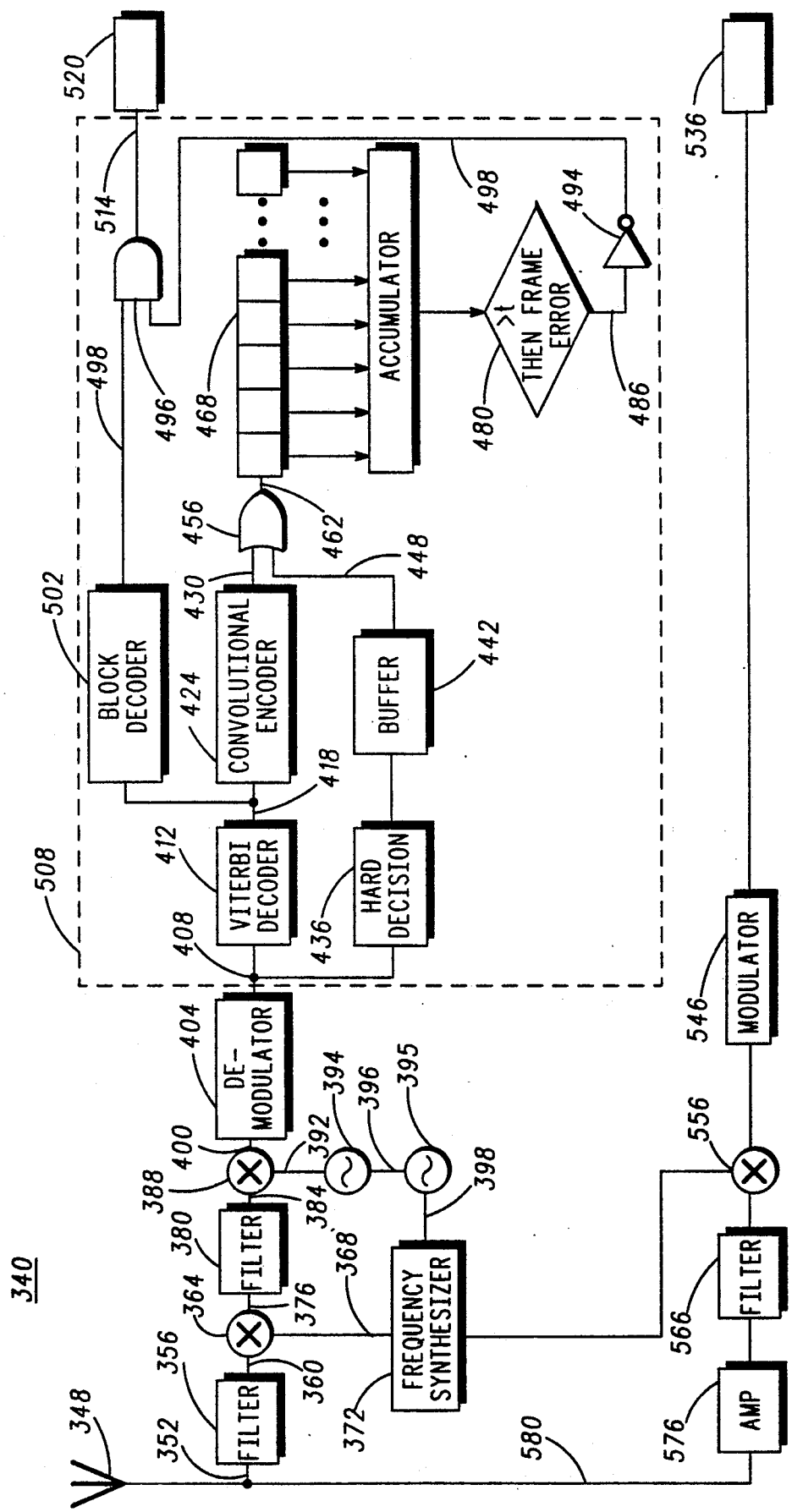
FIG. 5 is a partial block, partial flow diagram of a radiotelephone constructed according to the teachings of the present invention in which the error detection system of the present invention forms a portion thereof.

Turning now to the block diagram of FIG. 5, a transceiver, referred to generally by reference numeral 340, which incorporates the error detection system of the present invention is shown. A signal transmitted over a transmission channel is received by antenna 348, and an electrical signal indicative of the received signal is transmitted on line 352 to filter 356. Filter 356 generates a filtered signal on line 360 which is supplied to mixer 364. Mixer 364 receives an oscillating signal on line 368 from frequency synthesizer 372 to down convert in frequency the signal, and to generate a down-converted signal on line 376. Line 376 is coupled to filter 380 which generates a filtered signal on line 384 which is supplied to second mixer 388. Second mixer 388 receives an oscillating signal on line 392 generated by oscillator 394. (As illustrated, reference oscillator 395 is connected to oscillator 392 on line 396, and, additionally, to frequency synthesizer 372 on line 398, to provide reference frequency signals thereto.) Mixer 388 generates a second, down-converted signal on line 400 which is supplied to demodulator 404. Demodulator 404 generates a demodulated signal on line 408 which is supplied to Viterbi decoder 412. The demodulated signal generated by demodulator 404 is an analog signal which may be utilized by Viterbi decoder 412 as a soft decision signal to permit better decoding of the signal supplied to the decoder 412.

Viterbi decoder 412 corresponds to the Viterbi decoder 212 of FIG. 3. As described more fully in connection with error detection system 200 of FIG. 3, Viterbi decoder 412 generates a decoded signal on line 418 which is supplied to convolutional encoder 424. Convolutional encoder 424 generates a re-encoded signal on line 430. The signal generated on line 413 is supplied to hard decision block 436 which converts the signals supplied thereto on line 413 into a series of binary sequences which are stored in buffer 442. The binary sequences are supplied on line 448 to exclusive-OR logic gate 456. The re-encoded signal generated on line 430 is additionally supplied to gate 456. Gate 456 generates a comparison signal on line 462 which is supplied to shift register 468. Portions of the frame comprised of the comparison signal generated on line 462 are analyzed and when an excessive number of dissimilar bits are detected within a particular portion of a frame comprising the comparison signal, decision block 480 generates a signal on line 486 indicative of a bad frame. Such a signal passes through inverter 494 and is supplied to AND gate 496.

The decoded signal decoded by Viterbi decoder 412 is additionally supplied to gate 496 on line 498 by way of block decoder 502. Block decoder 502 generates a signal on line 498 only when decoder 502 detects the proper sequence of parity bits, described hereinabove. Elements 412-502 are preferably embodied by an algorithm embodied within a digital processor, as indicated by block 508, shown in hatch.

An output of gate 496 is provided on line 514 to speech/source decoder 520 only during times in which no bad frame indicator is generated on line 486, and block decoder 502 detects the proper sequence of parity bits. Decoder 520 may additionally comprise a transducer such as a speaker.

The block diagram of FIG. 5 further illustrates a transmit portion of radiotelephone 380 comprising speech/source encoder 536 (which may additionally comprise a transducer such as a microphone), modulator 546, mixer 556, filter 566 and amplifier 576. An amplified signal generated by amplifier 576 is applied to antenna 384 on line 580 to permit transmission therefrom.

Figure 6:
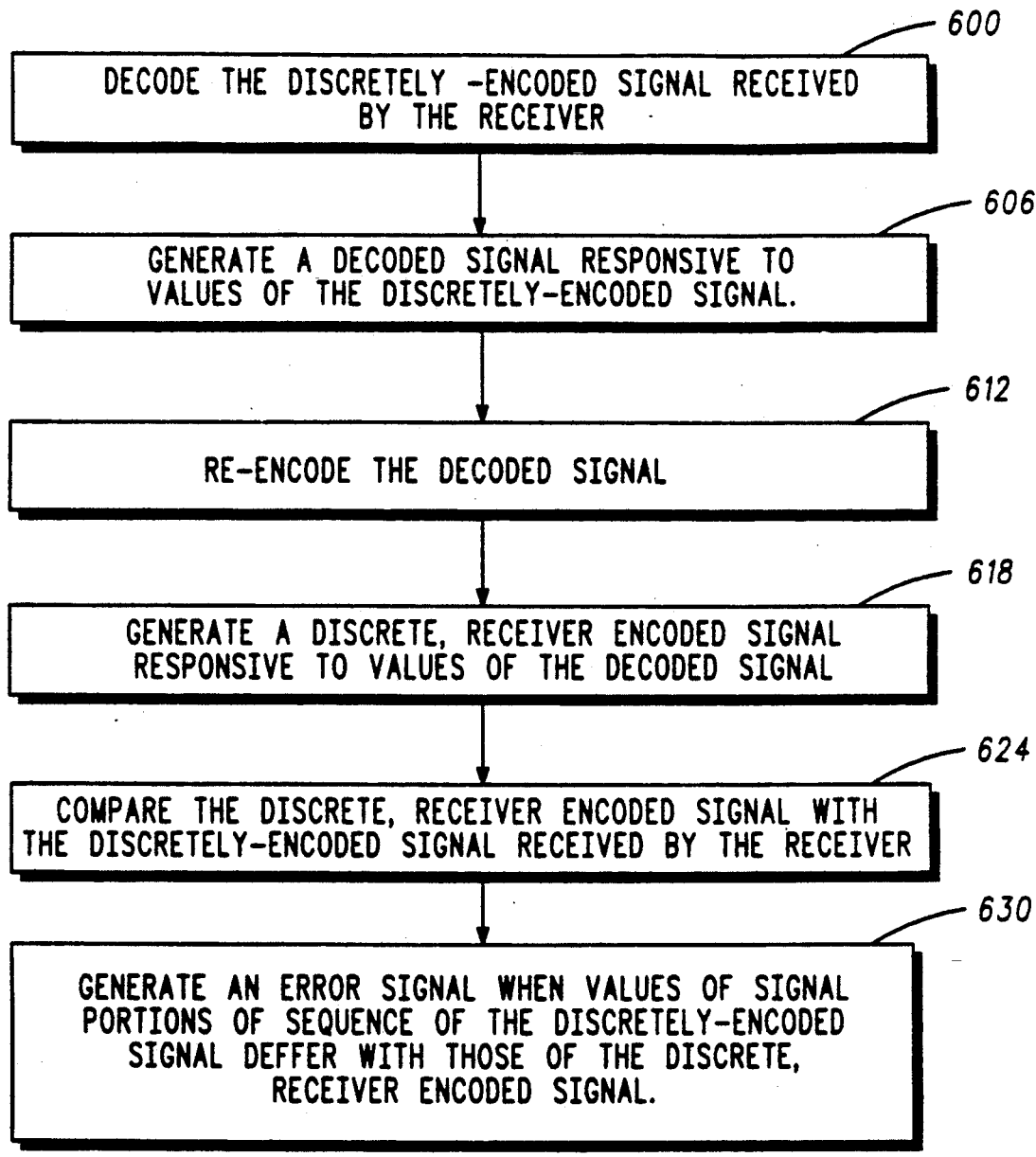
FIG. 6 is a logical flow diagram illustrating the steps of the method of the present invention.

Turning now to the logical flow diagram of FIG. 6, the method steps of the method of the present invention for detecting when a sequence of a discretely-encoded signal received by a receiver is comprised of an excessive number of invalid signal portions. First, and as indicated by block 600, the discretely-encoded signal received by the receiver is decoded. Next, and as indicated by block 606, a decoded signal is generated responsive to values of the discretely-encoded signal. Next, and as indicated by block 612, the decoded signal is re-encoded. Next, and as indicated by block 618, a discrete, receiver-encoded signal is generated responsive to values of the decoded signal. Next, and as indicated by block 624, the discrete, receiver encoded signal is compared with the discretely-encoded signal received by the receiver. Finally, and as indicated by block 630, an error signal is generated responsive to times in which values of signal portions of sequences of the discretely-encoded signal differ with values of corresponding sequences of the discrete, receiver-encoded signal at a frequency in excessive of a pre-determined amount.

While the present invention has been described in connection with the preferred embodiment shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. An error detection system for a receiver constructed to receive a discretely-encoded signal, said error detection system operative to detect when a sequence of the discretely-encoded signal received by the receiver is comprised of excessive numbers of invalid signal portions, said error detection system comprising:
   means for generating a soft decision signal representative of the discretely-encoded signal received by the receiver;
   means forming a decoder for decoding said soft-decision signal representative of the discretely-encoded signal generated by said means for generating the soft decision signal and for generating a decoded signal responsive to values of the soft decision signal;
   means forming a coder for re-encoding the decoded signal generated by the decoder and for generating a discrete, receiver-encoded signal responsive to values of the decoded signal;
   means forming a hard decision converter for converting the soft decision signal representative of the discretely-encoded signal received by the receiver into a hard decision signal;
   means forming a comparator for comparing the discrete, receiver-encoded signal generated by the coder with the hard decision signal; and
   means for generating an error signal responsive to times in which values of signal portions of a sequence of the hard decision signal differ with values of a corresponding sequence of the discrete, receiver-encoded signal in a density in excess of a predetermined value.

2. The error detection system of claim 1 wherein the decoder formed by the means for decoding comprises a Viterbi decoder.

3. The error detection system of claim 2 wherein the Viterbi decoder decodes the soft decision signal and generates a decoded signal sequence therefrom.

4. The error detection system of claim 1 wherein the coder formed by the means for re-encoding comprises a convolutional encoder.

5. The error detection system of claim 4 wherein the convolutional encoder encodes decoded signal sequences and generates discrete, receiver-encoded signal sequences therefrom.

6. The error detection system of claim 1 wherein said soft decision signal is comprised of a demodulated signal demodulated by the receiver.

7. The error detection system of claim 1 further comprising means forming a buffer for storing a sequence of signal portions of the hard decision signal formed by the hard decision converter.

8. The error detection system of claim 1 wherein the comparator formed by said means for comparing comprises means for performing an exclusive-or logic comparison.

9. The error detection system of claim 1 wherein said means for comparing generates a comparison signal comprised of signal portions responsive to comparisons between the discrete, receiver-encoded signal generated by the coder with the hard decision signal formed by the hard decision converter.

10. The error detection system of claim 9 further comprising means for storing said comparison signal generated by the means for comparing.

11. The error detection system of claim 10 wherein said means for generating further comprises means for determining when greater than a certain number of signal portions of at least one segmental portion of the soft decision signal representative of a sequence of the discretely-encoded signal differs with signal portions of a corresponding segmental portion of a corresponding sequence of the discrete, receiver-encoded signal.

12. The error detection system of claim 11 wherein said means for determining comprises counting numbers of times in which signal portions of a segmental portion of the comparison signal indicate nonsimilarity of corresponding signal portions of the soft-decision signal representative of the discretely-encoded signal received by the receiver differ with corresponding signal portions of the discrete, receiver-encoded signal.

13. The error detection system of claim 12 wherein the means for determining determines when greater than a certain number of signal portions of at least one of two or more segmental portions of the soft-decision signal representative of a sequence of the discretely-encoded signal differs with signal portions of at least one of two or more corresponding segmental portions of a corresponding sequence of the discrete, receiver-encoded signal.

14. The error detection system of claim 13 wherein the two or more segmental portions of the soft decision signal representative of the sequence of the discretely-encoded signal comprise at least one common signal portion.

15. A bad frame indicator for a receiver constructed to receive a discretely-encoded signal comprised of coded frames of a pre-determined number of bits, said bad frame indicator operative to detect when the receiver receives an invalid frame, said bad frame comprising:
   means for generating a soft-decision signal representative of the coded frames of the discretely-encoded signal received by the receiver;
   means forming a decoder for decoding said soft-decision signal representative of the coded frames of the discretely-encoded signal generated by said means for generating the soft-decision signal and for generating a decoded signal comprised of decoded frames responsive to values of the soft-decision signal;
   means forming a coder for re-encoding the decoded signal generated by the decoder and for generating a discrete, receiver-encoded signal comprised of coded frames responsive to values of the decoded signal;
   means forming a hard decision converter for converting the soft decision signal representative of the coded frames of the discretely-encoded signal received by the receiver into a hard decision signal;

means forming a comparator for comparing the coded frames of the discrete, receiver-encoded signal generated by the coder with the hard decision signal; and means for generating an error signal responsive to times in which at least one portion of a frame of the coded frames of the discrete, receiver-encoded signal differs with values of a portion of the hard decision signal corresponding to at least one portion of a frame of the coded frames of the discretely-encoded signal received by the receiver.

16. A transceiver constructed to receive a discretely-encoded signal comprised of coded frames of a predetermined number of bits, said transceiver comprising:

means forming an antenna for detecting said discretely-encoded signal;

means forming frequency conversion circuitry for down-converting the frequency of the discretely-encoded signal detected by the antenna;

means forming a decoder for decoding said discretely-encoded signal comprised of coded frames detected by the antenna and down-converted by the frequency conversion circuitry and applied thereto, and for generating a decoded signal comprised of decoded frames responsive to values of the discretely-encoded signal;

means forming a coder for re-encoding the decoded signal generated by the decoder and for generating a discrete, transceiver-encoded signal comprised of coded frames responsive to values of the decoded signal;

means forming a comparator for comparing the coded frames of the discrete, transceiver-encoded signal generated by the coder with the coded frames of the discretely-encoded signal received by the transceiver; and means for generating an error signal responsive to times in which at least one portion of a frame of the coded frames of the discrete, transceiver-encoded signal differs with values of a corresponding at least one portion of a frame of the coded frames of the discretely-encoded signal received by the transceiver.

17. A method for detecting when sequences of a discretely-encoded signal received by a receiver, constructed to receive discretely-encoded signals, are comprised of excessive numbers of invalid signal portions, said method comprising the steps of:

generating a soft-decision signal representative of the sequences of the discretely-encoded signal received by the receiver;

decoding said soft-decision signal representative of the discretely-encoded signal received by the receiver and applied thereto;

generating a decoded signal responsive to values of the soft decision signal;

re-encoding the decoded signal;

generating a discrete, receiver-encoded signal responsive to values of the decoded signal;

converting the soft-decision signal received by the receiver into a hard decision signal;

comparing the discrete, receiver encoded signal with the hard decision signal; and generating an error signal responsive to times in which values of signal portions of sequences of the hard decision signal differ with values of corresponding sequences of the discrete, receiver-encoded signal at a frequency in excess of a predetermined amount.

18. An error detection system for a receiver constructed to receive a discretely-encoded signal, said error detection system operative to detect when a sequence of the discretely-encoded signal received by the receiver is comprised of excessive numbers of invalid signal portions, said error detection system comprising:

means forming a Viterbi decoder for decoding said discretely-encoded signal received by the receiver and applied thereto, and for generating a decoded signal responsive to values of the discretely-encoded signal;

means forming a coder for re-encoding the decoded signal generated by the Viterbi decoder and for generating a discrete, receiver-encoded signal responsive to values of the decoded signal;

means forming a comparator for comparing the discrete, receiver-encoded signal generated by the coder with the discretely-encoded signal received by the receiver; and means for generating an error signal responsive to times in which values of signal portions of a sequence of the discretely-encoded signal received by the receiver differ with values of a corresponding sequence of the discrete, receiver-encoded signal in a density in excess of a predetermined value.

19. An error detection system for a receiver constructed to receive a discretely-encoded signal, said error detection system operative to detect when a sequence of the discretely-encoded signal received by the receiver is comprised of excessive numbers of invalid signal portions, said error detection system comprising:

means forming a decoder for decoding said discretely-encoded signal received by the receiver and applied thereto, and for generating a decoded signal responsive to values of the discretely-encoded signal;

means forming a convolutional coder for re-encoding the decoded signal generated by the decoder and for generating a discrete, receiver-encoded signal responsive to values of the decoded signal;

means forming a comparator for comparing the discrete, receiver-encoded signal generated by the convolutional coder with the discretely-encoded signal received by the receiver; and means for generating an error signal responsive to times in which values of signal portions of a sequence of the discretely-encoded signal received by the receiver differ with values of a corresponding sequence of the discrete, receiver-encoded signal in a density in excess of a predetermined value.

* * * * *